(12) United States Patent
Iida

(10) Patent No.: US 7,582,159 B2
(45) Date of Patent: Sep. 1, 2009

(54) METHOD FOR PRODUCING A SINGLE CRYSTAL

(75) Inventor: Makoto Iida, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 12 days.

(21) Appl. No.: 10/553,754

(22) PCT Filed: Apr. 26, 2004

(86) PCT No.: PCT/JP2004/006003

§ 371 (c)(1),
(2), (4) Date: Oct. 18, 2005

(87) PCT Pub. No.: WO2004/101868

PCT Pub. Date: Nov. 25, 2004

(65) Prior Publication Data

US 2007/0000429 A1    Jan. 4, 2007

(30) Foreign Application Priority Data

May 13, 2003  (JP) .............................. 2003-135085

(51) Int. Cl.
*C30B 15/10* (2006.01)
*C30B 15/20* (2006.01)

(52) U.S. Cl. .............................. 117/13; 117/11; 117/15; 117/39; 117/911

(58) Field of Classification Search .................. 117/205, 117/81, 83, 2, 3, 20, 13, 207, 328.1, 11, 15, 117/35, 37, 38, 39, 911; 423/328.1
See application file for complete search history.

(56) References Cited

U.S. PATENT DOCUMENTS

| 3,653,432 | A | * | 4/1972 | Schmid et al. | ................ | 117/83 |
| 3,798,007 | A | * | 3/1974 | Bochman et al. | .............. | 117/30 |
| 3,898,051 | A | * | 8/1975 | Schmid | ........................ | 117/83 |
| 4,108,236 | A | * | 8/1978 | Salkeld | ......................... | 164/513 |
| 4,178,986 | A | * | 12/1979 | Smashey | ..................... | 164/513 |

(Continued)

FOREIGN PATENT DOCUMENTS

JP    A 09-263485    10/1997

(Continued)

OTHER PUBLICATIONS

V.V. Voronokov; "The Mechanism of Swirl Defects Formation in Silicon"; Journal of Crystal Growth; vol. 59; Mar. 1982; pp. 625-643.

*Primary Examiner*—Carlos Lopez
*Assistant Examiner*—Seyed Masoud Malekzadeh
(74) *Attorney, Agent, or Firm*—Oliff & Berridge, Plc.

(57) ABSTRACT

A method for producing a single crystal by Czochralski method with pulling a seed crystal from a raw material melt, wherein in which a range of a pulling rate of pulling a single crystal, a temperature gradient at a solid-liquid interface and a highest temperature at an interface between a crucible and a raw material melt are defined. The single crystal is pulled with controlling the pulling rate and/or the temperature gradient at a solid-liquid interface within the determined range. The method produces a single crystal in which a desired defect region and/or a desired defect-free region can be determined more precisely and a single crystal with desired quality can be more surely pulled.

6 Claims, 6 Drawing Sheets

U.S. PATENT DOCUMENTS

| | | | |
|---|---|---|---|
| 4,190,094 A * | 2/1980 | Giamei | 164/122.1 |
| 4,202,400 A * | 5/1980 | Gigliotti et al. | 164/513 |
| 4,258,530 A * | 3/1981 | Mukumoto | 53/517 |
| 4,409,451 A * | 10/1983 | Taylor | 219/634 |
| 4,461,671 A * | 7/1984 | Seifert et al. | 117/63 |
| 4,770,704 A * | 9/1988 | Gibson et al. | 164/471 |
| 4,840,699 A * | 6/1989 | Khattak et al. | 117/3 |
| 5,116,456 A * | 5/1992 | Nestor | 117/83 |
| 5,134,261 A * | 7/1992 | Larkin et al. | 219/634 |
| 5,685,907 A * | 11/1997 | Fujikawa et al. | 117/205 |
| 5,772,761 A * | 6/1998 | Petroz | 117/206 |
| 5,998,257 A * | 12/1999 | Lane et al. | 438/253 |
| 6,048,395 A * | 4/2000 | Iida et al. | 117/20 |
| 6,066,306 A * | 5/2000 | Iida et al. | 423/328.1 |
| 6,086,671 A * | 7/2000 | Kawanishi et al. | 117/30 |
| 6,120,599 A * | 9/2000 | Iida et al. | 117/20 |
| 6,146,456 A * | 11/2000 | Mizugaki et al. | 117/2 |
| 6,309,461 B1 * | 10/2001 | Gianoulakis et al. | 117/206 |
| 6,334,896 B1 * | 1/2002 | Iida et al. | 117/20 |
| 6,348,180 B1 * | 2/2002 | Iida et al. | 423/348 |
| 6,458,204 B1 * | 10/2002 | Okui et al. | 117/30 |
| 6,461,427 B2 * | 10/2002 | Phillips et al. | 117/13 |
| 6,464,777 B2 * | 10/2002 | Kitamura et al. | 117/13 |
| 6,624,390 B1 * | 9/2003 | Motakef et al. | 219/407 |
| 6,673,330 B1 * | 1/2004 | Kitamura et al. | 423/594.8 |
| 6,902,618 B2 * | 6/2005 | Iida | 117/20 |
| 7,186,628 B2 * | 3/2007 | Nakano | 438/455 |
| 2001/0001944 A1 * | 5/2001 | Kitamura et al. | 117/13 |
| 2001/0018960 A1 * | 9/2001 | Thompson et al. | 164/122.1 |
| 2001/0025597 A1 * | 10/2001 | Falster et al. | 117/13 |
| 2003/0097975 A1 * | 5/2003 | Nettleton et al. | 117/13 |
| 2003/0116081 A1 * | 6/2003 | Falster et al. | 117/13 |
| 2003/0172865 A1 * | 9/2003 | Iida | 117/19 |
| 2003/0234092 A1 * | 12/2003 | Brinegar | 164/122.1 |
| 2004/0016743 A1 * | 1/2004 | Motakef et al. | 219/385 |
| 2005/0032331 A1 * | 2/2005 | Nakano | 438/459 |

FOREIGN PATENT DOCUMENTS

| | | |
|---|---|---|
| JP | A 11-147786 | 6/1999 |
| JP | A 11-349394 | 12/1999 |
| JP | A 2000-001391 | 1/2000 |
| JP | A 2000-044388 | 2/2000 |
| JP | A 2002-057160 | 2/2002 |
| JP | A 2002-201093 | 7/2002 |

* cited by examiner (a)

(b)

(c)

METHOD FOR PRODUCING A SINGLE CRYSTAL

TECHNICAL FIELD

The present invention relates to a method for producing a single crystal by Czochralski Method, more particularly, to a method for producing a single crystal occupied by a desired defect region and/or a desired defect-free region.

BACKGROUND TECHNOLOGY

A single crystal used as a substrate of semiconductor devices is, for example, a silicon single crystal. It is mainly produced by Czochralski Method (referred to as CZ method for short hereafter).

When producing a single crystal by CZ method, for example, an apparatus 1 for producing a single crystal as shown in FIG. 2 is used to produce the single crystal. This apparatus 1 for producing a single crystal has a member for containing and melting a polycrystalline material such as silicon, heat insulating members to insulate heat, and etc. They are installed in a main chamber 2. A pulling chamber 3 extending upwardly is continuously provided from a ceiling portion of the main chamber 2, and a mechanism (not shown) for pulling a single crystal 4 by a wire 5 is provided above it.

In the main chamber 2, a quartz crucible 7 for containing a melted raw material melt 6 and a graphite crucible 8 supporting the quartz crucible 7 are provided, and these crucibles 7 and 8 are supported by a shaft 9 so that they can be rotated and moved upwardly or downwardly by a driving mechanism (not shown). To compensate for decline of the melt level of the raw material melt 6 caused by pulling of the single crystal 4, the driving mechanism for the crucibles 7 and 8 is designed to rise the crucibles 7 and 8 as much as the melt level declines.

And, a graphite heater 10 for melting the raw material is provided so as to surround the crucibles 7 and 8. A heat insulating member 11 is provided outside the graphite heater 10 so as to surround it in order to prevent that the heat from the graphite heater 10 is directly radiated on the main chamber 2.

Moreover, a cooling cylinder 12 to cool a pulled single crystal is provided and at the bottom of it a graphite cylinder 13 is provided. A cooling gas is flowed downward from top through these cylinders so as to cool a pulled single crystal. And a heat insulating material 14 is provided on the outside of the lower end of the graphite cylinder 13 so as to oppose to the raw material melt 6 so that the heat radiation from the surface of the raw material melt 6 is intercepted and the temperature of the surface of the raw material melt 6 is kept.

A polycrystalline material is put in the quartz crucible 7 installed in the apparatus 1 for producing a single crystal as described above, the crucible 7 is heated by the graphite heater 10 to melt the polycrystalline material in the quartz crucible 7. A seed crystal 16 fixed by a seed holder 15 connected with the lower end of the wire 5 is immersed into the raw material melt 6 melted from the polycrystalline material. Thereafter, the single crystal 4 having a desired diameter and quality is grown under the seed crystal 16 by rotating and pulling the seed crystal 16. In this case, after bringing the seed crystal 16 into contact with the raw material melt 6, so-called necking, once forming a neck portion by narrowing the diameter to about 3 mm, is performed, and then, a dislocation-free crystal is pulled by spreading to a desired diameter.

A silicon single crystal produced by the CZ Method is mainly used to produce semiconductor devices. In recent years, semiconductor devices have come to be integrated higher and devices have come to be finer. Because devices have come to be finer, a problem of Grown-in defects introduced during growth of a crystal has become more important.

Hereafter, Grown-in defects will be explained (see FIG. 5).

In a silicon single crystal, when the growth rate of the crystal is relatively high, there exist Grown-in defects such as FPD (Flow Pattern Defect) and COP (Crystal Originated Particle), which are considered due to voids consisting of agglomerated vacancy-type point defects, at a high density over the entire radial direction of the crystal, and the region containing these defects is referred to as V (Vacancy) region. Furthermore, when the growth rate is further lowered, along with lowering of the growth rate, an OSF (Oxidation Induced Stacking Fault) region is generated from the periphery of the crystal as a shape of a ring. When the growth-rate is further lowered, the OSF ring shrinks to the center of the wafer and disappears. When the growth rate is further lowered, there exist defects such as LSEPD (Large Secco Etch Pit Defect) and LFPD (Large Flow Pattern Defect), which are considered due to dislocation loops consisting of agglomerated interstitial silicon atoms at a low density, and the region where these defects exist is referred to as I (Interstitial) region.

In recent years, a region containing no FPD and COP to be generated due to voids as well as no LSEPD and LFPD to be generated due to interstitial silicon atoms has been found between the V region and the I region and outside the OSF ring. The region is referred to as N (Neutral) region. In addition, it has been found that when further classifying N region, there exist Nv region (the region where a lot of vacancies exist) adjacent to the outside of OSF ring and Ni region (the region where a lot of interstitial silicon atoms exist) adjacent to I region, and that when performing thermal oxidation treatment, a lot of oxygen precipitates are generated in the Nv region and little oxygen precipitates are generated in the Ni region.

Furthermore, it has been found that, after thermal oxidation treatment, there exist a region where defects detected by Cu deposition process are particularly generated (hereinafter referred to as Cu deposition defect region) in a portion of the Nv region where oxygen precipitates tend to be generated. And it has been found that the Cu deposition defect region causes deterioration of electric property like oxide dielectric breakdown voltage characteristics.

It is considered that quantity of introduction of these Grown-in defects is determined by a parameter of a value of V/G which is a ratio of a pulling rate (V) and a temperature gradient (G) at the solid-liquid interface (for example, see V. V. Voronkov, Journal of Crystal Growth, 59 (1982) 625-643). Therefore, by controlling a pulling rate and a temperature gradient so that a value of V/G keeps constant, a single crystal occupied by desired defect region or desired defect-free region can be pulled.

For example, it is disclosed that, when a silicon single crystal is pulled, a single crystal occupied by defect-free region (for example, see Japanese Patent Laid-open (Kokai) No. H11-147786), and a single crystal having an OSF ring or nuclei in an OSF ring in the plane of the crystal and gettering property (for example, see Japanese Patent Laid-open (Kokai) No. 2000-44388) are pulled by controlling a value of V/G. Moreover, it is disclosed that a silicon single crystal occupied by I region is pulled by controlling a value of V/G and doping nitrogen (for example, see Japanese Patent Laid-open (Kokai) No. H11-349394), and a single crystal in which a size, density and distribution of defects are uniform is pulled also with doping nitrogen (for example, see Japanese Patent Laid-open (Kokai) No. 2002-57160). Then, from those single crystals produced above, for example, a wafer the whole plane of which is N region with excluding V region and I region, a wafer in which OSF is situated in the periphery, a wafer occupied by N region without Cu deposition defect region or the like can be produced.

However, for example, when a single crystal the whole plane of which is occupied by N region is pulled, distribution of defects is practically examined, a value of V/G including the region is obtained and a single crystal is pulled at the obtained value of V/G. There are many cases that the estimated value of V/G is different from a value of V/G that a single crystal the whole plane of which is N region can be actually obtained. Especially, there are such a case that, although a furnace structure (hot zone: HZ) is prepared so that a temperature gradient G at the solid-liquid interface becomes large in order to increase productivity of a single crystal of desired defect region and/or desired defect-free region by increasing a pulling rate V, a single crystal with desired quality can be pulled only when a pulling rate V is actually set lower than the estimated rate V. As explained above, there is a problem that a precise value of V/G including a desired defect region and/or a desired defect-free region is unknown and it is difficult to obtain efficiently a single crystal with high quality.

DISCLOSURE OF THE INVENTION

The present invention was accomplished in view of the aforementioned circumstances, and its object is to provide a method for producing a single crystal in which when a single crystal is pulled with controlling a value of V/G, the value of V/G including a desired defect region and/or a desired defect-free region is determined more precisely and a single crystal with desired quality can be more surely pulled.

The present invention was accomplished to achieve the aforementioned object, and there is provided a method for producing a single crystal by Czochralski method with pulling a seed crystal from a raw material melt, wherein when a pulling rate of pulling a single crystal is defined as V (mm/min), a temperature gradient at a solid-liquid interface is defined as G (K/mm) and a highest temperature at an interface between a crucible and a raw material melt is defined as Tmax(° C.), at least, a range of a value of V/G (mm$^2$/K·min) including a desired defect region and/or a desired defect-free region is determined according to the Tmax(° C.), and the single crystal is pulled with controlling a value of V/G (mm$^2$/K·min) within the determined range.

As described above, at least, a value of V/G (mm$^2$/K·min) including a desired defect region and/or a desired defect-free region is corrected according to the Tmax(° C.) and a range of the value of V/G is determined. By pulling a single crystal with controlling a value of V/G (mm$^2$/K·min) in the determined range, a value of V/G (mm$^2$/K·min) including a desired defect region and/or a desired defect-free region can be determined more precisely. Therefore, a single crystal occupied by a desired defect region and/or a desired defect-free region can be more surely pulled. In addition, a value of V/G including a desired defect region and/or a desired defect-free region according to various apparatuses for producing a single crystal can be estimated precisely. Furthermore, the present invention is useful to design an apparatus for producing a single crystal. Thereby, an single crystal with desired quality can be produced with great efficiency.

In addition, the temperature gradient G (K/mm) at a solid-liquid interface means a temperature gradient in a range from melting point of a raw material (in the case of silicon, it is 1412° C.) to 1400° C. Moreover, controlling a value of V/G (mm$^2$/K·min) means controlling a value of V/G over almost the entire radial direction of a crystal (except for the region 0-2 cm from the periphery because it is out-diffusion region).

In this case, it is possible that the single crystal is pulled with controlling the value of V/G (mm$^2$/K·min) in a range from −0.000724×Tmax+1.31 to less than −0.000724×Tmax+1.38.

As described above, by pulling the single crystal with controlling the value of V/G (mm$^2$/K·min) in a range from −0.000724×Tmax+1.31 to less than −0.000724×Tmax+1.38, a single crystal including N region and/or OSF region can be surely produced.

It is more preferable that by pulling the single crystal with controlling the value of V/G (mm$^2$/K·min) in a range from −0.000724×Tmax+1.31 to −0.000724×Tmax+1.37, a single crystal including N region can be surely produced.

In this case, it is possible that the single crystal is pulled with controlling the value of V/G (mm$^2$/K·min) in a range of −0.000724×Tmax+1.38 or more.

As described above, by pulling the single crystal with controlling the value of V/G (mm$^2$/K·min) in a range of −0.000724×Tmax+1.38 or more, a single crystal excluding OSF ring outside can be surely produced.

In this case, it is possible that the single crystal is pulled with controlling the value of V/G (mm$^2$/K·min) in a range from −0.000724×Tmax+1.31 to −0.000724×Tmax+1.35.

As described above, by pulling the single crystal with controlling the value of V/G (mm$^2$/K·min) in a range from −0.000724×Tmax+1.31 to −0.000724×Tmax+1.35, a single crystal including N region without Cu deposition defect region can be surely produced.

In these cases, it is preferable that the single crystal is pulled with the Tmax(° C.) being in a range of 1560° C. or less.

As described above, if the Tmax(° C.) is in a range of 1560° C. or less, the value of V/G becomes large enough. Accordingly, a pulling rate V (mm/min) for pulling a single crystal including a desired defect region and/or a desired defect-free region can be increased enough, productivity of a single crystal can be improved enough.

In these cases, it is possible that, at least, the Tmax(° C.) is changed by providing a heat insulating material between the crucible containing the raw material melt and a heater provided so as to surround the crucible, or by providing a heat insulating material below the crucible.

As described above, at least, by providing a heat insulating material between the crucible containing the raw material melt and a heater provided so as to surround the crucible, or by providing a heat insulating material below the crucible, the Tmax(° C.) can be changed to a desired temperature.

In these cases, a silicon single crystal is pulled as the single crystal.

In recent years, because apparatuses for producing a single crystal have been diversified, it becomes difficult to precisely determine the value of V/G including a desired defect region and/or a desired defect-free region. Furthermore, demand for quality of a silicon single crystal has come to be strict. The method for producing a single crystal of the present invention is particularly ideal for producing such a silicon single crystal.

In these cases, a single crystal with a diameter of 200 mm or more is pulled as the single crystal.

The method for producing a single crystal of the present invention is particularly ideal for producing a single crystal with a diameter of 200 mm or more that has been highly demanded in recent years and has come to be strict about demand for quality.

A single crystal produced by the method for producing a single crystal of the present invention has high quality.

As explained above, according to the present invention, when a single crystal is pulled with controlling a value of V/G, the value of V/G including a desired defect region and/or a desired defect-free region can be determined more precisely, thereby a single crystal with desired quality can be more surely pulled at a high level of productivity.

(a) shows a range of a value of V/G and Tmax that a single crystal of N region and OSF region is pulled, (b) shows a range of a value of V/G and Tmax that a single crystal of V region is pulled, and (c) shows a range of a value of V/G and Tmax that a single crystal of N region without Cu deposition defect region is pulled.

Figure 4:
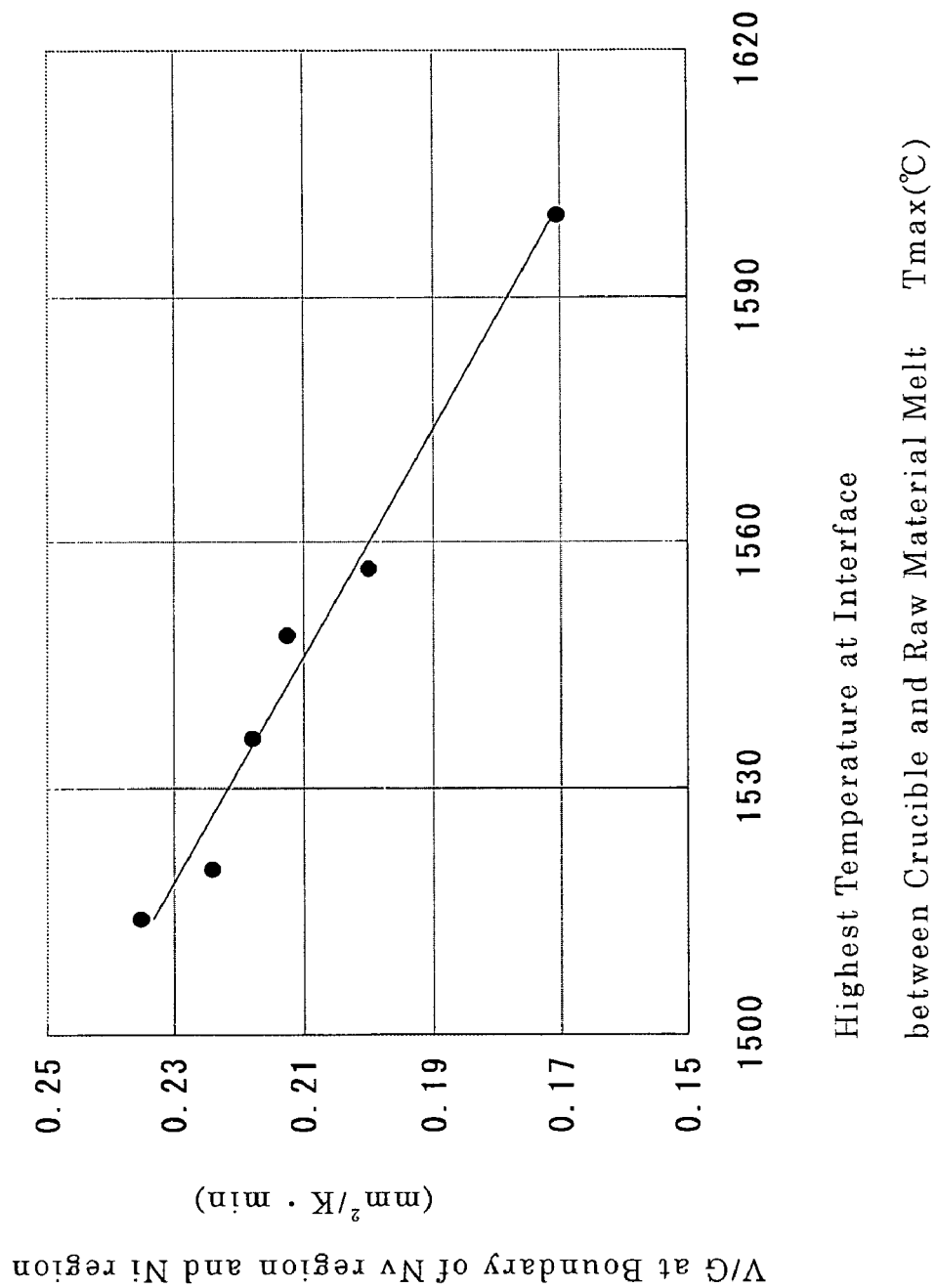

FIG. 4 is a graph showing a relationship between a value of V/G at a boundary of Nv region and Ni region and Tmax(° C.).

Figure 5:
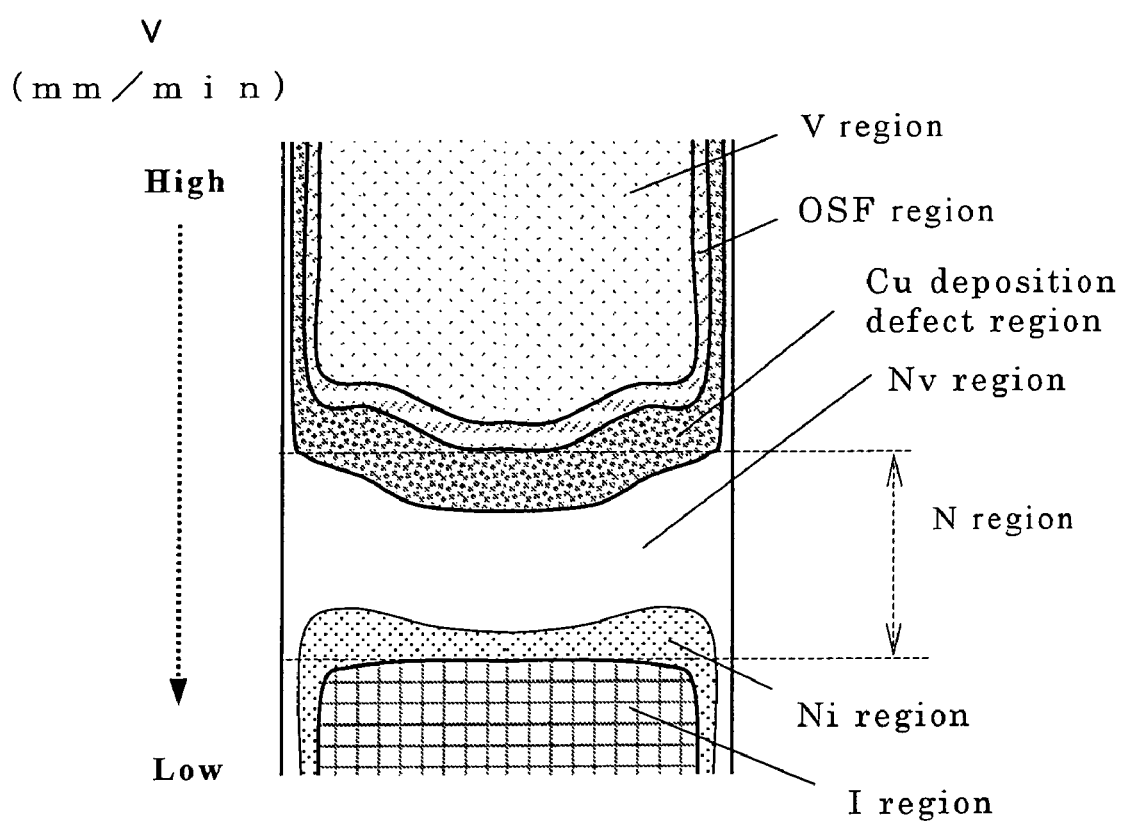

FIG. 5 is an explanatory view showing a relationship between a growth rate and a distribution of crystal defects.

Figure 6:
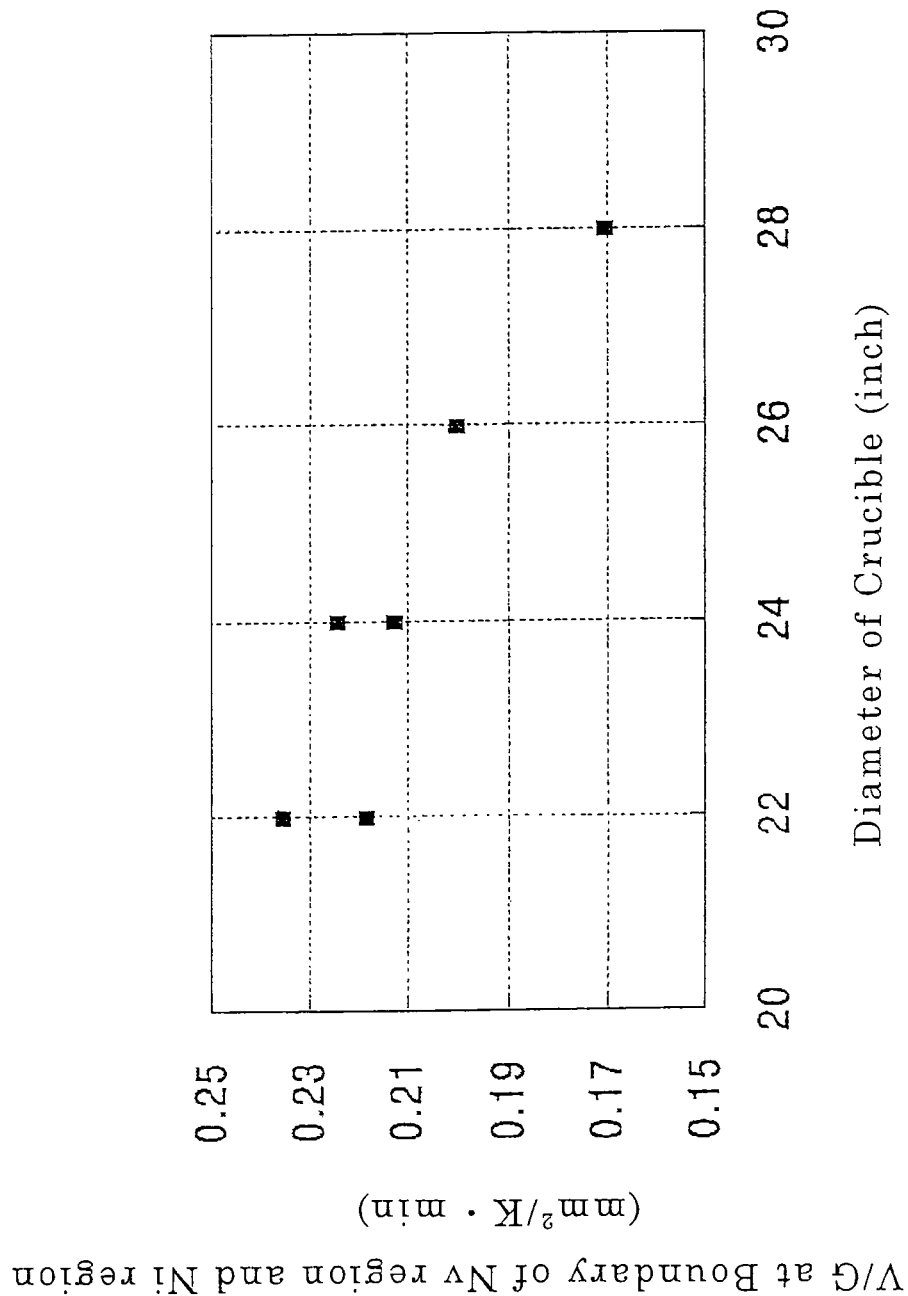

FIG. 6 is a graph showing a relationship between a value of V/G at a boundary of Nv region and Ni region and a diameter of a crucible.

BEST MODE FOR CARRYING OUT THE INVENTION

Hereinafter, embodiments of the present invention will be described. However, the present invention is not limited thereto.

The inventors of the present invention performed thorough investigations by utilizing experiments, simulations etc. Consequently, it has been found that a case that an estimated value of V/G is different from an actual value of V/G, for example, a case that an estimated pulling rate V for pulling a single crystal of a desired defect region and/or a desired defect-free region is different from an actual pulling rate V in spite of pulling a single crystal with the same defect distribution, is caused when single crystals of a desired defect region and/or a desired defect-free region are pulled by using furnace structures (hot zone: HZ) with various conformations because a value of V/G including the region varies according to HZ respectively. Then, the inventors of the present invention considered that if a common parameter that can be used in various HZs can be found, a more appropriate value of V/G can be determined according to HZ respectively. Thus, they accomplished the present invention.

Namely, the present invention provides a method for producing a single crystal by Czochralski method with pulling a seed crystal from a raw material melt, wherein when a pulling rate of pulling a single crystal is defined as V (mm/min), a temperature gradient at a solid-liquid interface (from melting point of a raw material to 1400° C.) is defined as G (K/mm) and a highest temperature at an interface between a crucible and a raw material melt is defined as Tmax(° C.), at least, a range of a value of V/G (mm²/K·min) including a desired defect region and/or a desired defect-free region is determined according to the Tmax(° C.), and the single crystal is pulled with controlling a value of V/G (mm²/K·min) over almost the entire radial direction of the crystal (except for the region 0-2 cm from the periphery) within the determined range.

As described above, in the present invention, not only a value of V/G but also a highest temperature Tmax(° C.) at an interface between a crucible and a raw material melt are used as a common parameter for various HZs. The Tmax(° C.) can be obtained, for example, by providing thermocouples from the bottom to the periphery of a crucible at intervals of 2 cm and measuring a temperature, or by calculating on simulation.

FIG. 4 is a graph showing the relationship between a value of V/G at a boundary of Nv region and Ni region and Tmax(° C.). As it is clear from FIG. 4, because the value of V/G and Tmax(° C.) have good correlation, the Tmax(° C.) turns out to be a very useful parameter for determining the value of V/G including a desired defect region and/or a desired defect-free region. Therefore, in order to determine the value of V/G to be controlled, correction by the Tmax(° C.) is necessary.

Accordingly, at least, a range of a value of V/G (mm²/K·min) including a desired defect region and/or a desired defect-free region is determined according to Tmax(° C.), and a single crystal is pulled with controlling a value of V/G (mm²/K·min) within the determined range. Thereby, a single crystal of a desired defect region and/or a desired defect-free region can be surely pulled. In addition, a value of V/G (mm²/K·min) including a desired defect region and/or a desired defect-free region is determined more precisely according to various HZs respectively. Thereby, when an apparatus with any HZ is used, a crystal with desired quality can be obtained efficiently and the present invention is useful to design an apparatus for producing a single crystal.

Figure 3:
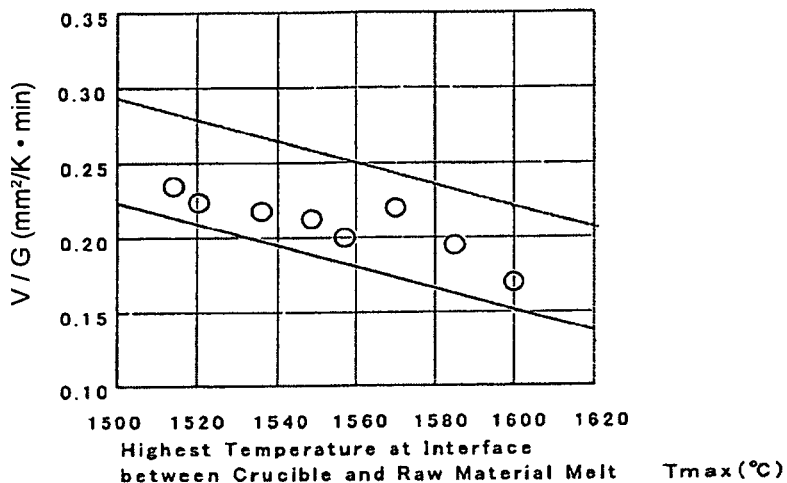
FIG. 3 is a graph showing a range of a value of V/G and Tmax that a single crystal of a desired defect region and/or a desired defect-free region is pulled.
Figure 3:
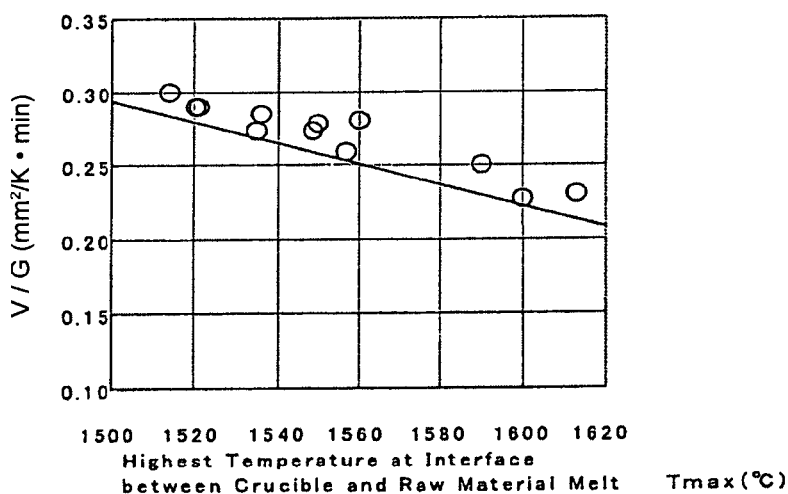
Figure 3:
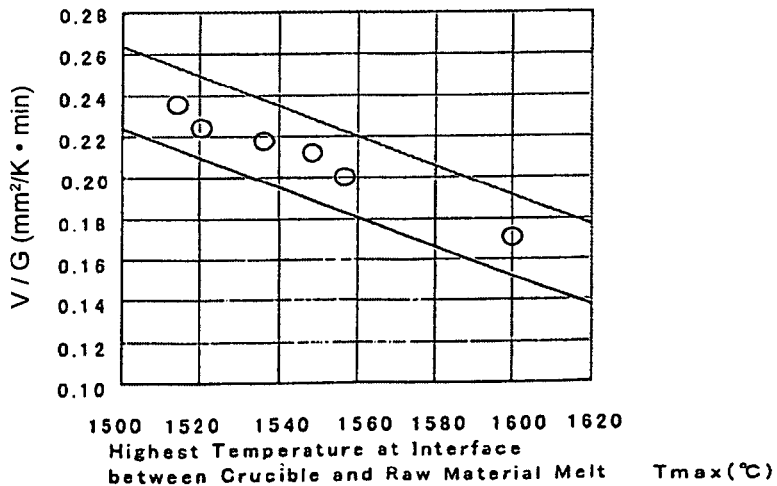

Then, a range of a value of V/G and Tmax that a single crystal of a desired defect region and/or a desired defect-free region is pulled is investigated in detail. The result is shown in FIG. 3. FIG. 3(a) is a graph showing a range of a value of V/G and Tmax that a single crystal of N region and OSF region is pulled. FIG. 3(b) is a graph showing a range of a value of V/G and Tmax that a single crystal of V region is pulled. FIG. 3(c) is a graph showing a range of a value of V/G and Tmax that a single crystal of N region without Cu deposition defect region is pulled.

As it is clear from FIG. 3(a), by pulling a single crystal with controlling a value of V/G (mm²/K·min) in a range from −0.000724×Tmax+1.31 to less than −0.000724×Tmax+1.38, a single crystal of N region and/or OSF region can be surely pulled.

It is more preferable to pull a single crystal with controlling a value of V/G (mm²/K·min) in a range from −0.000724×Tmax+1.31 to −0.000724×Tmax+1.37. Thereby, a single crystal of N region can be surely pulled.

As it is clear from FIG. 3(b), by pulling a single crystal with controlling a value of V/G (mm²/K·min) in a range of −0.000724×Tmax+1.38 or more, a single crystal excluding OSF ring outside can be surely obtained.

Furthermore, as it is clear from FIG. 3(c), by pulling a single crystal with controlling a value of V/G (mm²/K·min) in a range from −0.000724×Tmax+1.31 to −0.000724×Tmax+1.35, a single crystal including N region without Cu deposition defect region can be more surely obtained.

In addition, as it is clear from FIG. 3(a)-(c), by setting the Tmax(° C.) in a range of 1560° C. or less, a value of V/G (mm²/K·min) including a desired defect region and/or a desired defect-free region can be sufficiently high. For example, as shown in FIGS. 3(a) and (c), when the Tmax(° C.) is 1560° C. or less, it is found that the value of V/G (mm$^2$/K·min) at a boundary of I region and N region can be of a high value of 0.18 or more. Therefore, a single crystal with desired quality can be produced at a high level of productivity.

A highest temperature Tmax(° C.) at an interface between a crucible and a raw material melt can be changed by changing HZ.

For example, the Tmax(° C.) is changed to a desired range, at least, by providing a heat insulating material between the crucible containing the raw material melt and a heater provided so as to surround the crucible, or by providing a heat insulating material below the crucible.

Figure 1:
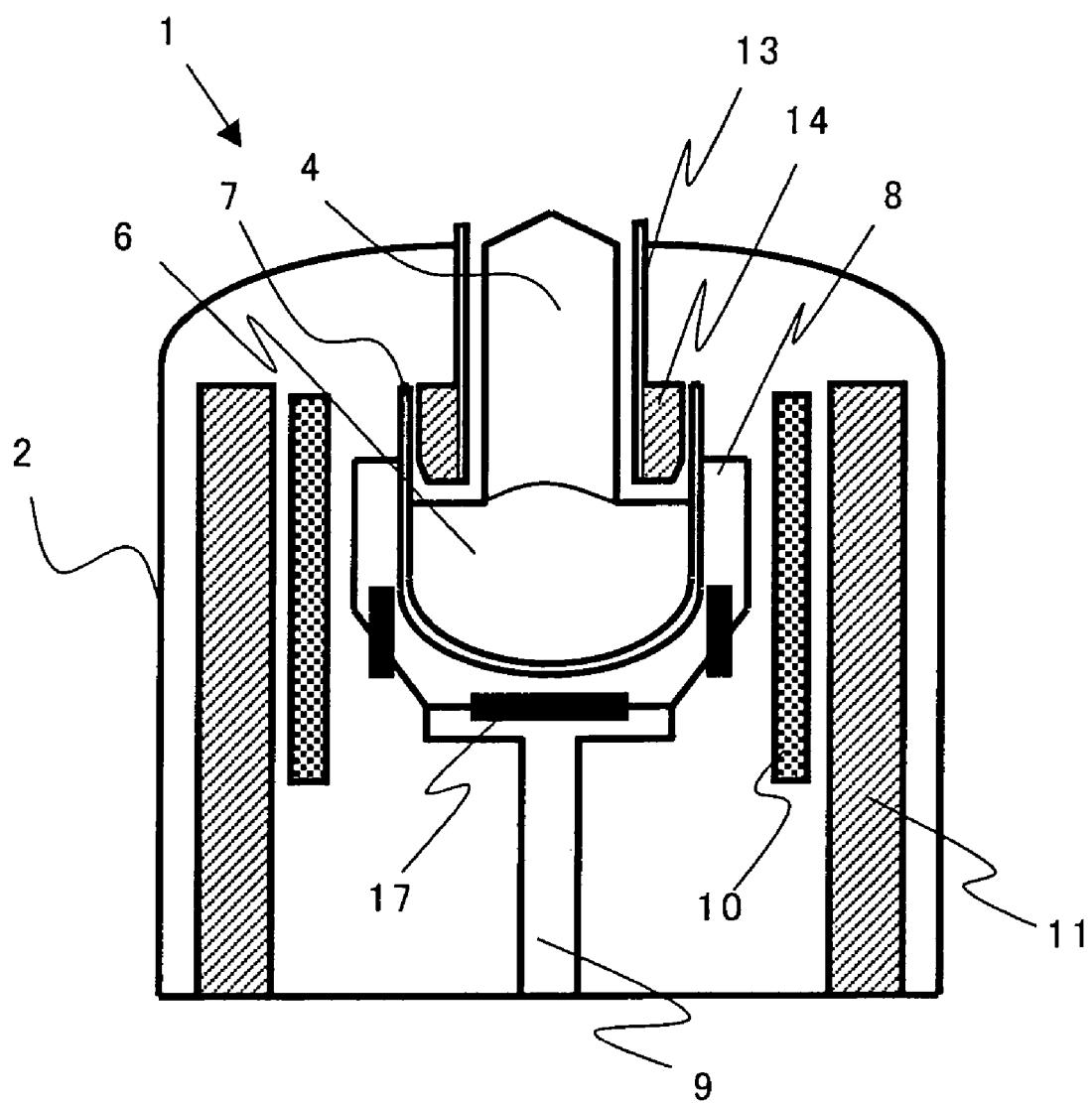
FIG. 1 is a schematic sectional view of an apparatus for producing a single crystal in which heat insulating materials are provided below and at the side of the crucible.
Figure 2:
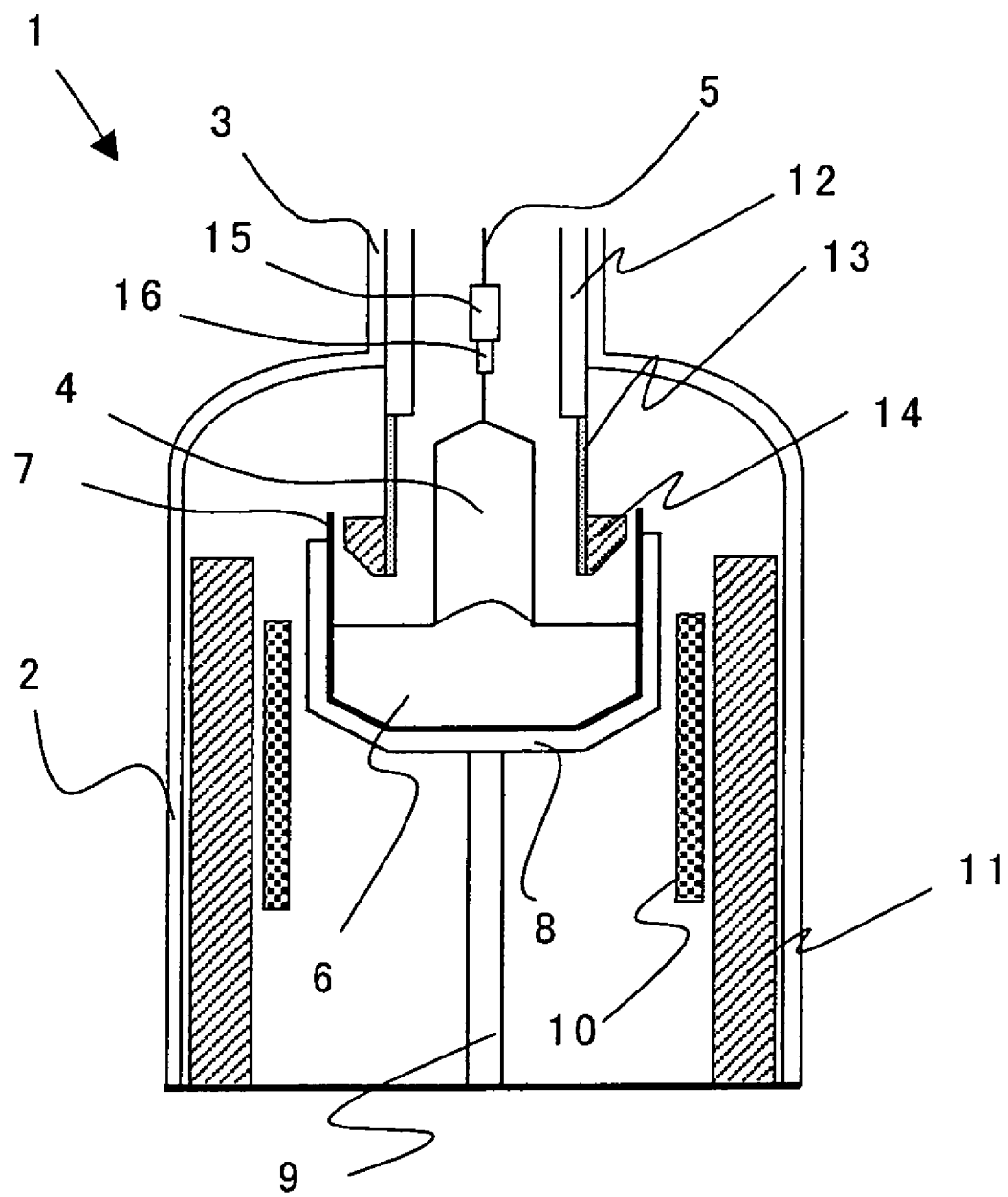
FIG. 2 is a schematic sectional view of a conventional apparatus for producing a single crystal.

For example, an apparatus 1 for producing a single crystal in which heat insulating materials are provided below and at the side of a crucible is shown in FIG. 1. The apparatus 1 for producing a single crystal is almost the same as the apparatus for producing a single crystal as shown in FIG. 2 except that the heat insulating materials 17 are provided below and at the side of the crucible. Namely, in the apparatus 1 for producing a single crystal, in the main chamber 2, the single crystal 4, the raw material melt 6, the quartz crucible 7, the graphite crucible 8, the shaft 9, the graphite heater 10, the heat insulating member 11, the graphite cylinder 13, the heat insulating material 14 and the heat insulating material 17 for the crucible are shown here. In these components, particularly, by providing a heat insulating material 17 for the crucible with varying numbers, a size, position, material etc., the Tmax (° C.) can be changed to a desired range.

In addition, the Tmax(° C.) can also be changed by changing a size of a crucible. For example, if a size of a crucible is smaller, the Tmax(° C.) can be set lower. Therefore, by making a size of a crucible smaller, a value of V/G including a desired defect region and/or a desired defect-free region can be set higher as shown in FIG. 6. For example, if the size of a crucible is set larger than a diameter of a single crystal to be pulled but not larger than 2.5 times the diameter of the single crystal, then the Tmax(° C.) can be low enough. Therefore, a value of V/G including a desired defect region and/or a desired defect-free region can be set in a high range enough.

In recent years, because apparatuses for producing a single crystal have been even more diversified, it has become difficult to precisely determine a value of V/G including a desired defect region and/or a desired defect-free region. Furthermore, demand for quality of a silicon single crystal has come to be strict. The method for producing a single crystal of the present invention as described above is particularly ideal for producing such a silicon single crystal.

Furthermore, the method for producing a single crystal of the present invention is particularly ideal for producing a single crystal with a diameter of 200 mm or more that has been highly demanded in recent years and has come to be strict about demand for quality.

And a single crystal produced by the method for producing a single crystal of the present invention has high quality.

Hereinafter, the present invention will be explained further in detail with reference to Examples.

EXAMPLE 1

Using an apparatus for producing a single crystal, which has the crucible with a diameter of 600 mm (24 inches), as shown in FIG. 1, a silicon single crystal with a diameter of 8 inches (200 mm) was pulled so that the whole plane of the crystal would be N region without Cu deposition defect region.

For that purpose, firstly, heat insulating materials were provided below and at the side of the crucible, the highest temperature Tmax(° C.) at an interface between the crucible and a raw material melt was set at 1514 (° C.). In order to produce a single crystal including N region without Cu deposition defect region when the Tmax(° C.) is set above, a range of a value of V/G (mm$^2$/K·min) should be in the range from 0.21 to 0.25 (from −0.000724×1514+1.31 to −0.000724× 1514+1.35) (See FIG. 3(c)). Accordingly, the range from 0.22 to 0.24 was selected as a range of a value of V/G (mm$^2$/K·min) to unfailingly pull a single crystal the whole plane of which is occupied by N region without Cu deposition defect region. Next, a single crystal was pulled with controlling a value of V/G (mm$^2$/K·min) within the selected range. Namely, because a temperature gradient G at an solid-liquid interface in the HZ of the apparatus A for producing a single crystal was 2.337 K/mm, the single crystal was pulled with controlling a pulling rate V from 0.51 mm/min to 0.56 mm/min.

The silicon single crystal pulled as described above was examined and it was found that the whole plane of the crystal was occupied by N region without Cu deposition defect region and the crystal had high quality.

EXAMPLE 2

Using the same apparatus for producing a single crystal as Example 1, a silicon single crystal with a diameter of 8 inches (200 mm) was pulled so that the whole plane of the crystal would be N region without Cu deposition defect region. However, heat insulating materials which can change a highest temperature Tmax (° C.) at an interface between a crucible and a raw material melt were not provided.

In the apparatus for producing a single crystal, the highest temperature Tmax(° C.) at an interface between a crucible and a raw material melt was 1560 (° C.). In order to produce a single crystal including N region without Cu deposition defect region with the Tmax(° C.), a range of a value of V/G (mm$^2$/K·min) should be in the range from 0.18 to 0.22 (from −0.000724×1560+1.31 to −0.000724×1560+1.35). Accordingly, the range from 0.19 to 0.21 was selected as a range of a value of V/G (mm$^2$/K·min) to unfailingly pull a single crystal the whole plane of which is occupied by N region without Cu deposition defect region. Next, a single crystal was pulled with controlling a value of V/G (mm$^2$/K·min) within the selected range. Namely, because a temperature gradient G at a solid-liquid interface in the HZ of the apparatus for producing a single crystal was 2.500 K/mm, the single crystal was pulled with controlling a pulling rate V from 0.48 mm/min to 0.53 mm/min.

The silicon single crystal pulled as described above was examined and it was found that the whole plane of the crystal was occupied by N region without Cu deposition defect region and the crystal had high quality.

EXAMPLE 3

Using a different apparatus for producing a single crystal, which has a crucible with a diameter of 750 mm (30 inches), from that of Example 1 and 2, a silicon single crystal with a diameter of 8 inches (200 mm) was pulled so that the whole plane of the crystal would be N region without Cu deposition defect region.

In the apparatus for producing a single crystal, the highest temperature Tmax(° C.) at an interface between the crucible and a raw material melt was 1600° C. In order to produce a single crystal including N region without Cu deposition defect region with the Tmax(° C.), a range of a value of V/G (mm²/K·min) should be in the range from 0.15 to 0.19 (from −0.000724×1600+1.31 to −0.000724×1600+1.35). Accordingly, the range from 0.16 to 0.18 was selected as a range of a value of V/G (mm²/K·min) to unfailingly pull a single crystal the whole plane of which is occupied by N region without Cu deposition defect region. Next, a single crystal was pulled with controlling a value of V/G (mm²/K·min) within the selected range. Namely, because a temperature gradient G at a solid-liquid interface in the HZ of the apparatus for producing a single crystal was 2.674 K/mm, the single crystal was pulled with controlling a pulling rate V from 0.43 mm/min to 0.48 mm/min.

The silicon single crystal pulled as described above was examined and it was found that the whole plane of the crystal was occupied by N region without Cu deposition defect region and the crystal had high quality.

EXAMPLE 4

Using almost the same apparatus for producing a single crystal as Example 1, a silicon single crystal with a diameter of 8 inches (200 mm) was pulled so that the whole plane of the crystal would not be defect-free region, but with excluding OSF ring outside, almost over the entire radial direction of the crystal would be V region. However, in the apparatus for producing a single crystal used here, the position of a heat insulating material 14 was adjusted so that the distance between the surface of a raw material melt 6 and the lower end of the heat insulating material 14 was as half as that of the apparatus for producing a single crystal of Example 1.

In the apparatus for producing a single crystal, the highest temperature Tmax(° C.) at an interface between the crucible and the raw material melt was 1514° C. In order to produce a single crystal almost over the entire radial direction of which include V region with the Tmax(° C.), a range of a value of V/G (mm²/K·min) should be in the range of 0.28 or more (−0.000724×1514+1.38 or more). And, a value of V/G (mm²/K·min) needs to be in a range of 1.90 or less (−0.000724×1514+3.0 or less) that a single crystal can be grown without being deformed. Accordingly, the range from 0.29 to 0.31 was selected as a range of a value of V/G (mm²/K·min) to unfailingly pull a single crystal almost over the entire radial direction of which include V region. Next, a single crystal was pulled with controlling a value of V/G (mm²/K·min) within the selected range. Namely, because the maximum temperature gradient G at a solid-liquid interface in the HZ of the apparatus for producing a single crystal was 4.07 K/mm, the single crystal was pulled with controlling a pulling rate V from 1.18 mm/min to 1.26 mm/min.

The silicon single crystal pulled as described above was examined and it was confirmed that OSF ring was surely excluded almost over the entire radial direction of the single crystal.

As it is clear from Examples 1-3, by using a highest temperature Tmax(° C.) at an interface between a crucible and a raw material melt as a parameter to determine a value of V/G, a value of V/G including N region without Cu deposition defect region was precisely determined according to an apparatus for producing a single crystal respectively. Accordingly, by controlling a value of V/G as determined above, a single crystal including N region without Cu deposition defect region can be surely pulled. In addition, as it is clear from Examples 1 and 2, by providing heat insulating materials and changing Tmax (° C.) to lower temperature, a value of V/G including N region without Cu deposition defect region could be set higher. Accordingly, a pulling rate V could be set higher, and thus productivity of a single crystal could be improved.

In addition, the present invention is not limited to the embodiment described above. The above-described embodiment is mere an example, and those having substantially the same structure as technical ideas described in the appended claims and providing the similar functions and advantages are included in the scope of the present invention.

For example, in the present invention, the method for producing a single crystal was explained in the case of not doping impurities such as nitrogen and carbon (non-dope). However, in the case of doping impurities such as nitrogen and carbon, although a value of V/G differs considerably from the case of non-dope, a value of V/G has the same relationship with Tmax in such a case, too. Therefore, to correct on Tmax for a value of V/G including defect regions that changes according to respective impurities and their concentrations are included in the scope of the present invention.

The invention claimed is:

1. A method for producing a single crystal by Czochralski method by pulling a seed crystal from a raw material melt, comprising:

immersing the seed crystal into the raw material melt; and
growing the single crystal by rotating and pulling the seed crystal, wherein:
the single crystal is pulled while controlling a value of V/G (mm²/K·min) within a range of values of V/G (mm²/K·min); and
the range of values of V/G (mm²/K·min), including a defect region and/or a defect-free region, is controlled according to Tmax(° C.); wherein:
V (mm/min) is a single crystal pulling rate of pulling the single crystal;
G (K/mm) is a temperature gradient at a solid-liquid interface, in a range of a melting point of the raw material and 1400° C.;
Tmax(° C.) is a highest temperature of the raw material melt at an interface between a quartz crucible inner wall and the raw material melt; and
the range of values of V/G (mm²/K·min) is:
(A) from −0.000724 [mm²/(° C.·K·min)]×Tmax(° C.)+1.31 (mm²/K·min) to less than −0.000724 [mm²/(° C.·K·min)]×Tmax(° C.)+1.38 (mm²/K·min); or
(B) −0.000724 [mm²/(° C.·K·min)]×Tmax(° C.)+1.38 (mm²/K·min) or more; or
(C) from −0.000724 [mm²/(° C.·K·min)]×Tmax(° C.)+1.31 (mm²/K·min) to −0.000724 [mm²/(° C.·K·min)]×Tmax(° C.)+1.35 (mm²/K·min).

2. The method for producing a single crystal according to claim 1, wherein the single crystal is pulled with the Tmax(° C.) being in a range of 1560° C. or less.

3. The method for producing a single crystal according to claim 1, wherein, at least, the Tmax(° C.) is changed by providing a heat insulating material between the crucible containing the raw material melt and a heater provided so as to surround the crucible, or by providing a heat insulating material below the crucible.

4. The method for producing a single crystal according to claim 2, wherein, at least, the Tmax(° C.) is changed by providing a heat insulating material between the crucible containing the raw material melt and a heater provided so as to surround the crucible, or by providing a heat insulating material below the crucible.

5. The method of producing a single crystal according to claim 1, wherein the single crystal that is pulled is a silicon single crystal.

6. The method of producing a single crystal according to claim 1, wherein the single crystal that is pulled has a diameter of 200 mm or more.

* * * * *